US010216213B2

(12) United States Patent
Chu

(10) Patent No.: US 10,216,213 B2
(45) Date of Patent: Feb. 26, 2019

(54) METHODS AND APPARATUSES INCLUDING A PROCESS, VOLTAGE, AND TEMPERATURE INDEPENDENT CURRENT GENERATOR CIRCUIT

(71) Applicant: Micron Technology, Inc., Boise, ID (US)

(72) Inventor: Wei Lu Chu, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/762,162

(22) PCT Filed: Apr. 30, 2015

(86) PCT No.: PCT/CN2015/078013
§ 371 (c)(1),
(2) Date: Jul. 20, 2015

(87) PCT Pub. No.: WO2016/172936
PCT Pub. Date: Nov. 3, 2016

(65) Prior Publication Data
US 2018/0173267 A1    Jun. 21, 2018

(51) Int. Cl.
*G05F 3/02* (2006.01)
*G05F 3/30* (2006.01)
*G11C 5/14* (2006.01)

(52) U.S. Cl.
CPC . *G05F 3/30* (2013.01); *G11C 5/14* (2013.01)

(58) Field of Classification Search
CPC ..................................................... G05F 3/02
See application file for complete search history.

(56) References Cited

U.S. PATENT DOCUMENTS

| 6,323,630 | B1 | 11/2001 | Banba | |
|---|---|---|---|---|
| 7,071,767 | B2* | 7/2006 | Ou-yang | G05F 3/30 327/539 |
| 7,456,678 | B2* | 11/2008 | Passerini | G05F 3/30 327/513 |
| 8,373,496 | B2* | 2/2013 | Cusinato | G05F 3/242 323/312 |

(Continued)

FOREIGN PATENT DOCUMENTS

CN     102253683     11/2011

OTHER PUBLICATIONS

International Search Report and Written Opinion received for PCT/CN2015/078013 dated Jan. 26, 2015.

*Primary Examiner* — Hai L Nguyen
(74) *Attorney, Agent, or Firm* — Dorsey & Whitney LLP

(57) ABSTRACT

Apparatuses, methods, and current generators that generate current are described. An example apparatus includes a current source configured to provide a current. The current source may be coupled to a voltage source via a transistor. The transistor may be configured to provide the voltage source to the current source based on a voltage of a gate of the transistor. The example apparatus may further include an amplifier configured to provide a voltage to the gate of the transistor based on a voltage differential between two inputs. The voltage differential between the two inputs may adjust due to process, voltage or temperature changes such that the current provided by the current source remains constant.

12 Claims, 3 Drawing Sheets

(56) References Cited

U.S. PATENT DOCUMENTS

| | | |
|---|---|---|
| 2006/0043957 A1 | 3/2006 | Carvalho |
| 2006/0164158 A1* | 7/2006 | Kimura .................... G05F 3/30 327/539 |
| 2006/0279270 A1 | 12/2006 | Chen et al. |
| 2006/0290415 A1 | 12/2006 | Hazucha et al. |

* cited by examiner

METHODS AND APPARATUSES INCLUDING A PROCESS, VOLTAGE, AND TEMPERATURE INDEPENDENT CURRENT GENERATOR CIRCUIT

CROSS-REFERNCE TO RELATED APPLICATION

This application is a 371 National Stage Filing of International Application No. PCT/CN2015/078013 filed Apr. 30, 2015. The aforementioned application is incorporated herein by reference, in its entirety, for any purpose.

DESCRIPTION OF RELATED ART

In many devices that incorporate analog, digital, and/or mixed-signal integrated circuits, current generators and voltage reference circuits are of critical importance to the proper functioning of the device. To that end, most conventional computing devices depend on stable, temperature-independent current and voltage references. As the critical dimensions of integrated circuits have decreased over time, the operating voltages of these integrated circuits have also decreased. With the decrease in operating voltages of integrated circuits, the need for temperature-independent, low-power current and voltage reference circuits has increased. Many of these voltage reference circuits provide a stable reference voltage output while operating at voltages at or below 1.3V.

One of the ways to reduce the costs associated with the manufacture of integrated circuits involves limiting the area used to implement circuits within the integrated circuit. In general, circuits that are less complex and require less area to implement are less expensive to manufacture. Further, by reducing the area required to implement some of the circuits within an integrated circuit, it may be possible to reduce the overall size of the integrated circuit, permitting the integrated circuit to be incorporated into smaller devices.

SUMMARY

Example apparatuses are disclosed herein. An example apparatus may include a plurality of transistors coupled to a voltage source. A gate of each of the plurality of transistors may be coupled to a bias line. The example apparatus may further include a first circuit coupled to a first transistor of the plurality of transistors, and a second circuit coupled to a second transistor of the plurality of transistors. The example apparatus may further include an output node coupled to a third transistor of the plurality of transistors, and an amplifier comprising a first input coupled to a node between the first transistor and the first circuit and a second input coupled to a node between the second transistor and the second circuit. The amplifier may be configured to provide an output voltage to the bias line responsive to a voltage differential between the first input and the second input. The output voltage may be applied to the bias line provides a current through the third transistor that remains substantially constant in temperature coefficient.

Example current generators are disclosed herein. An example current generator may include a first transistor configured to provide a current. The first transistor may be coupled to a voltage source, and may be configured to provide the voltage source to an output node based on a voltage of a gate of the first transistor. The example current generator may further include an amplifier configured to provide an output voltage to the gate of the first transistor based on a voltage differential between two inputs. The voltage differential between the two inputs may adjust due to process, voltage or temperature changes such that the current provided by the first transistor remains substantially constant in temperature coefficient.

Examples of methods are described herein. An example method may include providing an output voltage from an amplifier responsive to a voltage differential at inputs of the amplifier, and responsive to the output voltage, coupling a voltage source to an output node via a first transistor. The example method may further include providing a current through the first transistor based on the output voltage, and adjusting the output voltage based on a change in the voltage differential caused by a process, voltage, or temperature change such that the current provided by the first transistor remains substantially constant in temperature coefficient.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
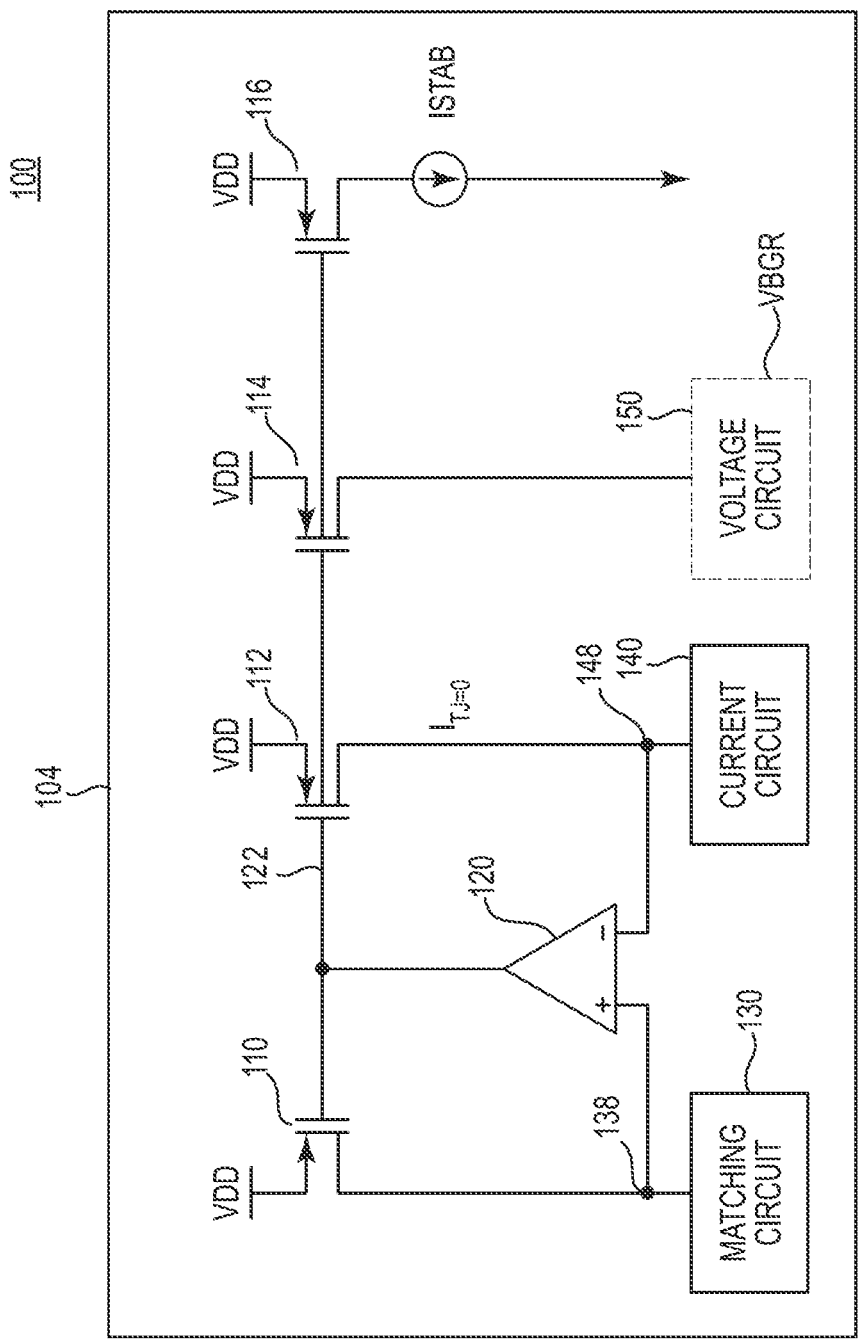
FIG. 1 is a block diagram of a particular illustrative embodiment of an apparatus including current generator according to an embodiment of the disclosure.

Referring to FIG. 1, a particular illustrative embodiment of an apparatus including a current generator 104 is disclosed and generally designated 100. As used herein, examples of apparatuses may include an integrated circuit, a memory device, a memory system, an electronic device or system, a smart phone, a tablet, a computer, a server, etc. The current generator 104 may include transistors 110, 112, 114, and 116 each having a gate coupled to a bias line 122. The transistors 110, 112, 114, and 116 may each couple a power supply VDD to a matching circuit 130, a current circuit 140, a voltage circuit 150, and an output node of the current generator 104, respectively. The voltage on the bias line 122 may be controlled by an output of an amplifier 120.

The amplifier 120 may include a first input coupled to a first node 138 between the transistor 110 and the matching circuit 130. The amplifier 120 may include a second input coupled to a second node 148 between the transistor 112 and the current circuit 140. The output of the amplifier 120 may be based on a voltage differential between the first input and the second input.

The matching circuit 130 and the current circuit 140 may include circuitry is configured to adjust to changes in process, voltage and/or temperature (PVT). The voltages at the first node 138 and the second node 148 may adjust based on the changes in the matching circuit 130 and the current circuit 140, respectively, due to the PVT changes. Responsive to the adjusted voltages at the first node 130 and the second node 148, the amplifier 120 may adjust an output voltage provided to the bias line 122. Based on the relationship between circuitry of the matching circuit 130 and circuitry of the current circuit 140, the output voltage driven by the amplifier 120 to the bias line 122 may result in the temperature slope of $I_{Tj=0}$ current through the transistor 112 being equal to zero (e.g., or approximately zero).

In some embodiments, the current generator 104 may further include the voltage circuit 150. The voltage circuit 150 may be coupled the transistor 114 and a reference source. The voltage circuit 150 may be configured to provide a constant band-gap voltage VBGR responsive to a voltage received via the 114, which may be based on the bias line 122 voltage driven by the amplifier 120.

In operation, the amplifier 120 may receive voltages from the first node 138 and the second node 148 at respective inputs. Based on the received inputs, the amplifier 120 may provide the output voltage to the bias line 122. The voltage of the bias line 122 may control the gates of the transistors 110, 112, 114, and 116 to couple the VDD voltage to the matching circuit 130, the current circuit 140, the voltage circuit 150, and the output node of the current generator 104, respectively. In some embodiments, the VDD voltage may be equal to or greater than 0.9 V. For example, the VDD voltage may be between 1.0 and 1.35 volts. In some embodiments, voltages at the first node 138 and the second node 148 may adjust based on properties of the matching circuit 130 and the current circuit 140 caused by variation in PVT. Responsive to the changes in the voltages at the first node 138 and the second node 148, the amplifier 120 may adjust a voltage provided to the bias line 122. The coordinated adjustments of the voltage of the first node 138, the voltage of the second node 148, and the output voltage of the 120 may maintain a stable (e.g., substantially constant in temperature coefficient) current via the transistor 116. In some embodiments, the current generator 104 may also provide voltage circuit 150 that provides a constant VBGR voltage based on the output voltage provided by the amplifier 120 to the bias line 122.

The voltage of the first node 138 may be based on properties of the matching circuit 130 and the VDD voltage. The voltage of the second node 148 may be based on properties of the current circuit 140 and the VDD voltage. Operationally, changes in the voltage provided by the amplifier 120 may result in changes in voltages at the first node first node 238 and second node 148. The matching circuit 130 and the current circuit 140 may include circuitry that adjusts to variance in PVT in a predictable manner such that the voltage driven by the amplifier 120 on the bias line 122 results in the current through the transistor 116 remaining stable despite the variance in PVT. Thus, the inputs of the amplifier 120 (e.g., via the first node first node 138 and the second node 148, respectively) may be based on properties of the matching circuit 130 and current circuit 140. The matching circuit 130 and the current circuit 140 may be designed such that changes in respective properties due to variance in PVT may adjust in the inputs to the amplifier 120. Responsive to the adjusted inputs to the amplifier 120, the amplifier 120 may drive the output voltage to the 122 such that the temperature slope of $I_{TJ=0}$ current between the transistor 112 and the current circuit 140 substantially remains equal to zero despite the PVT variance. By maintaining the temperature slope of $I_{TJ=0}$ current at zero, the current through the transistor 116 and the VBGR voltage may remain substantially constant despite variance in PVT.

A current generator 104 including only a single amplifier 120 may reduce power consumption and a footprint as compared with conventional current generators that include two or more amplifiers.

Figure 2:
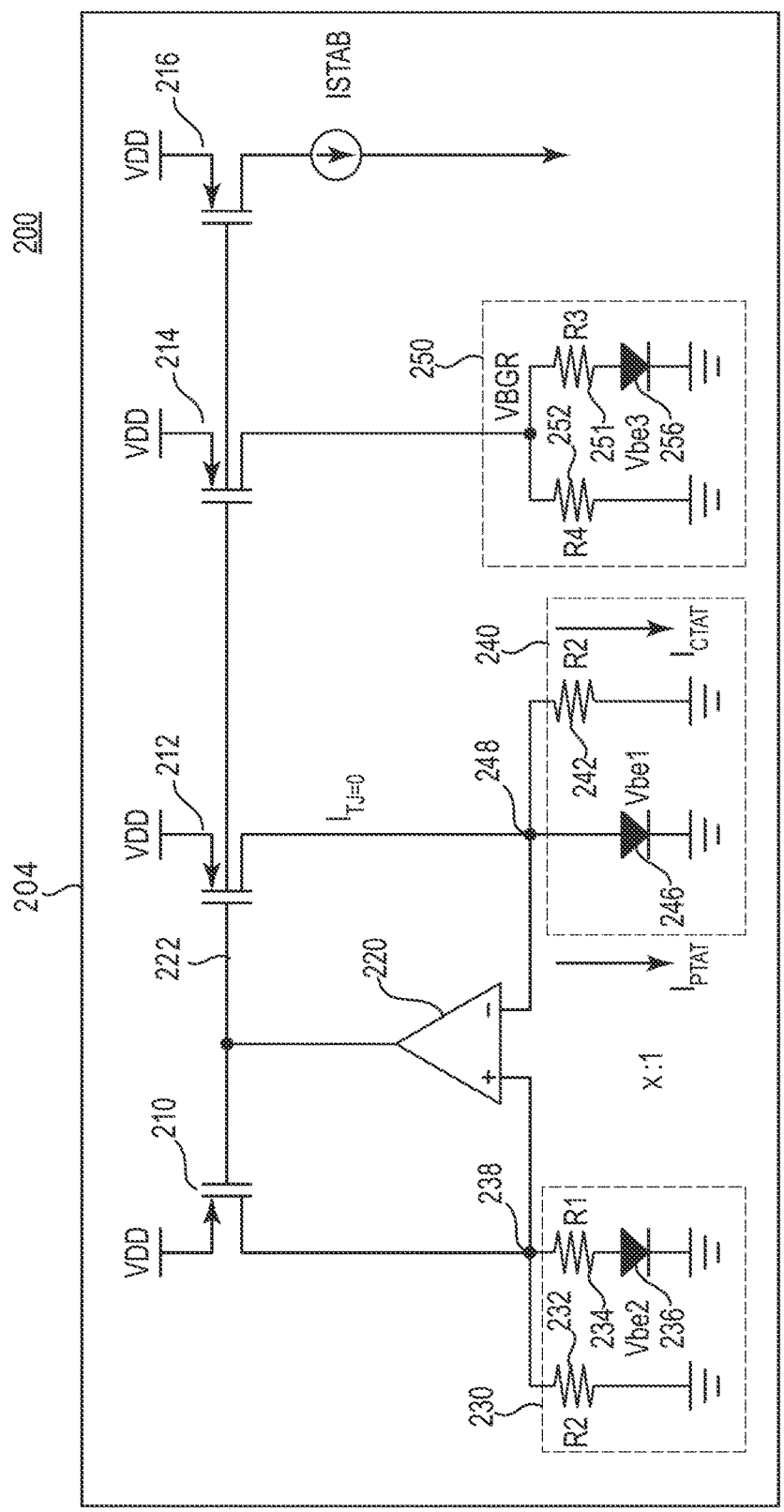
FIG. 2 is a block diagram of a particular illustrative embodiment of an apparatus including a current generator according to an embodiment of the disclosure.

Referring to FIG. 2, a particular illustrative embodiment of an apparatus including a current generator 204 is disclosed and generally designated 200. The current generator 204 may include transistors 210, 212, 214, and 216 each having a gate coupled to a bias line 222. The transistors 210, 212, 214, and 216 may each couple a power supply VDD to a matching circuit 230, current circuit 240, voltage circuit 250, and an output node of the current generator 204, respectively. The output of the amplifier 220 may drive the voltage of the bias line 222. The current generator 204 may be implemented in the current generator 104 of FIG. 1.

The amplifier 220 may include a first input coupled to a first node 238 between the transistor 210 and the matching circuit 230. The amplifier 220 may include a second input coupled to a node second node 248 between the transistor 212 and the current circuit 240. The output of the amplifier 220 may be based on a voltage differential between the first input 238 and the second input 248.

The matching circuit 230 and the current circuit 240 may include circuitry that is configured to adjust to changes in PVT. Coupled between the first node 238 and a reference source, the matching circuit 230 may include a resistor 232 coupled in parallel with a serially coupled resistor 234 and diode 236. Coupled between the second node 248 and the reference source, the current circuit 240 may include a resistor 242 coupled in parallel with diode 246. In some embodiments, the size of the diode 236 may be greater than the size of the diode 246. For example, the diode 236 may be eight times larger than the diode 246. In some embodiments, the resistor 232 may has the same impedance as the resistor 242. The voltages at the nodes 238 and second node 248 may change responsive to changes in properties of the matching circuit 230 and the current circuit 240 due to the PVT variance. The amplifier 220 may adjust the output voltage responsive to the changes in the input voltages from the 238 and second node 248.

In some embodiments, the current generator 204 may include the voltage circuit 250 configured to provide a constant bandgap voltage VBGR at an output. The voltage circuit 250 may include a resistor 252 coupled in parallel with a serially coupled resistor 251 and diode 256. The voltage circuit 250 may be coupled to the VDD via the transistor 214.

In operation, the amplifier 220 may receive voltages from the first node 238 and the second node 248 at respective inputs. Based on the received inputs, the amplifier 220 may provide the output voltage to the bias line 222. The voltage of the bias line 222 may control the gates of the transistors 210, 212, 214, and 216 to couple the VDD voltage to the matching circuit 230, the current circuit 240, the voltage circuit 250, and the output node of the current generator 204, respectively. In some embodiments, the VDD voltage may be equal to or greater than 0.9 V. For example, the VDD voltage may be between 1.0 and 1.35 volts. In some embodiments, voltages at the first node 238 and the second node 248 may adjust based on properties of the matching circuit 230 and the current circuit 240 caused by variation in PVT. Responsive to the changes in the voltages at the first node 238 and the second node 248, the amplifier 220 may adjust a voltage provided to the bias line 222. The coordinated adjustments of the voltage of the first node 238, the voltage of the second node 248, and the output voltage of the 220 may maintain a stable (e.g., substantially constant in temperature coefficient) current via the transistor 216. In some embodiments, the current generator 204 may also provide voltage circuit 250 that provides a constant VBGR voltage based on the output voltage provided by the amplifier 220 to the bias line 222.

The voltage of the first node 238 may be based on properties of the matching circuit 230 and the VDD voltage. The voltage of the second node 248 may be based on properties of the current circuit 240 and the VDD voltage. Operationally, changes in the voltage provided by the amplifier 220 may result in changes in voltages at the first node first node 238 and second node 248. The matching circuit 230 and the current circuit 240 may include circuitry that adjusts to variance in PVT in a predictable manner such that the voltage driven by the amplifier 220 on the bias line 222 results in the current through the transistor 216 remaining stable despite the variance in PVT. Thus, the inputs of the amplifier 220 (e.g., via the first node first node 238 and the second node 248, respectively) may be based on properties of the matching circuit 230 and current circuit 240. The matching circuit 230 and the current circuit 240 may be designed such that changes in respective properties due to variance in PVT may adjust in the inputs to the amplifier 220. Responsive to the adjusted inputs to the amplifier 220, the amplifier 220 may drive the output voltage to the 222 such that the temperature slope of $I_{TJ=0}$ current between the transistor 212 and the current circuit 240 substantially remains equal to zero despite the PVT variance. By maintaining the temperature slope of $I_{TJ=0}$ current at zero, the current through the transistor 216 and the VBGR voltage may remain substantially constant despite variance in PVT.

For example, a current proportional to absolute temperature IPTAT may flow through the diode 246. The IPTAT current may change proportionately with temperature changes (e.g., an increase in temperature may result in an increase in IPTAT current, and vice versa). Further, a current complementary to absolute temperature ICTAT may flow through the resistor 242. The ICTAT current may change proportionately inverse to temperature changes (e.g., an increase in temperature may result in a decrease in the ICTAT current, and vice versa). The $I_{TJ=0}$ current may be a sum of the IPTAT and the ICTAT currents. The relationship between the circuits of the matching circuit 230 and current circuit 240 may result in the temperature slope of sum of the IPTAT and ICTAT currents substantially being equal to zero.

Assuming a ratio of X to one in terms of size of the diode 236 relative to the size of the diode 246, the impedance values for the resistor 232 (e.g., R2), resistor 234 (e.g., R1), resistor 242 (e.g., R2), resistor 251 (e.g., R3), and resistor 252 (e.g., R4) may be computed as follows:

$$I_{Tj=0} = \frac{Vbe1}{R2} + \frac{Vbe1-Vbe2}{R1}$$

$$Vbe1 - Vbe2 = \Delta Vbe = Vt*\ln\frac{Id1}{Is1} - Vt*\ln\frac{Id2}{Is2} = Vt*\ln\frac{Id1}{Is1}*\frac{Is2}{Id2}$$

$$Id2 = Id1$$

$$Is2 = X*Is1$$

$$Vbe1 - Vbe2 = \Delta Vbe = Vt*\ln X = \frac{kT}{q}*\ln X$$

$$\therefore I_{Tj=0} = \frac{Vbe1}{R2} + \frac{kT}{q}*\frac{\ln X}{R1};$$

and $$I_{Tj=0} = \frac{VBGR}{R4} + \frac{VBGR-Vbe3}{R3}$$

-continued $$I_{Tj=0} = \frac{Vbe1}{R2} + \frac{Vbe1-Vbe2}{R1} = \frac{VBGR}{R4} + \frac{VBGR-Vbe3}{R3}$$

$$VBGR = \left(\frac{R3}{R2}*Vbe1 + Vbe3 + \frac{kT}{q}*\frac{R3}{R1}*\ln X\right)*\frac{R4}{R3+R4}$$

where T is the absolute temperature, k is the Boltzmann constant, q is the magnitude of an electrical charge on an electron, and Vbe2 is a voltage across the diode 236, Vbe1 is a voltage across the diode 246, and Vbe3 is a voltage across the diode 256. Id2 is a current run across the diode 236 and Id1 is a current run across the diode 246. Is2 is the reverse saturate current of the diode 236 and Is1 is the reverse saturate current of the diode 246. The R1-R4 impedances may be calculated assuming that $$\frac{\partial I_{Tj=0}}{\partial T} = 0 \text{ and } \frac{\partial VBGR}{\partial T} = 0.$$

In an example where the ratio of the size of the diode 236 relative to the size of the diode 246 is 8 to 1, exemplary R1-R4 impedances that may be used are: R1=20 KΩ, R2=625 KΩ, R3=250 KΩ, and R4=300 KΩ. Using these exemplary values, the VBGR may be maintained at a low power voltage of 0.7 volts. Further, the ISTAB current variation through the transistor 216 may be maintained within less than 1.5% variance across PVT changes.

By using a single amplifier 120 to generate a constant VBGR and ISTAB, the area and power consumption by the current generator 204 may be decreased relative to current generators that use multiple amplifiers.

Figure 3:
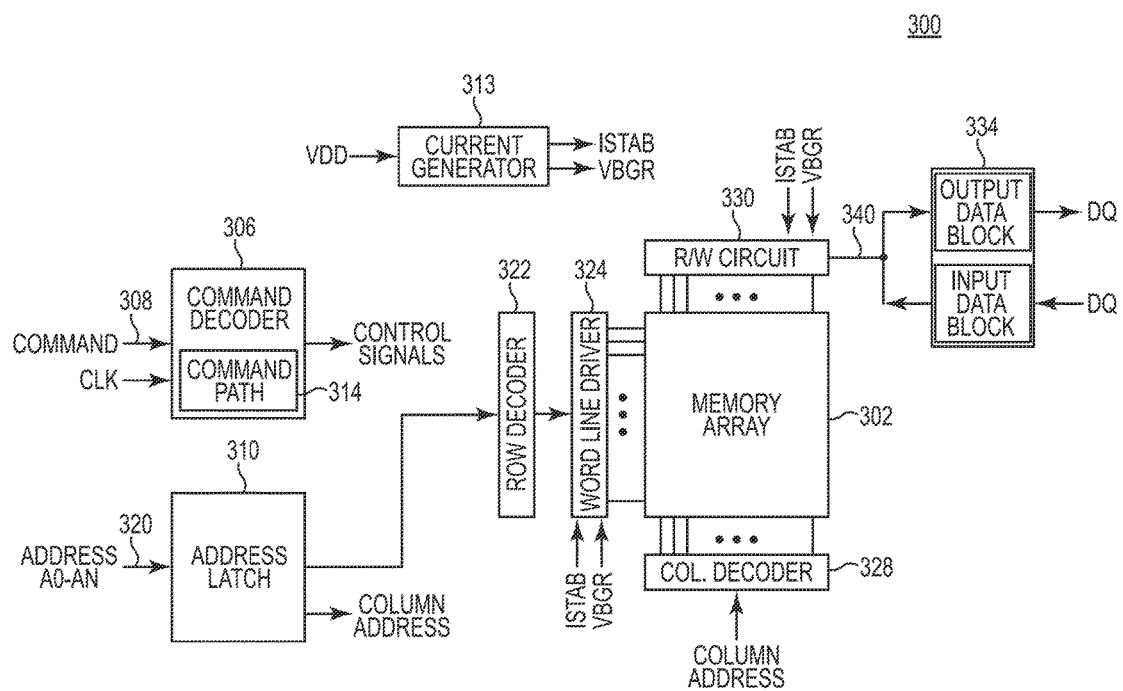
FIG. 3 is a block diagram of a memory including a current generator according to an embodiment of the disclosure.

Referring to FIG. 3, block diagram of a memory 300 including a delay line circuit according to an embodiment of the disclosure. The memory 300 may include an array 302 of memory cells, which may be, for example, dynamic random-access memory (DRAM) memory cells, static random-access memory (SRAM) memory cells, flash memory cells, or some other types of memory cells. The memory 300 includes a command decoder 306 that may receive memory commands through a command bus 308 and provide (e.g., generate) corresponding control signals within the memory 300 to carry out various memory operations. Row and column address signals may be provided (e.g., applied) to an address latch 310 in the memory 300 through an address bus 320. The address latch 310 may then provide (e.g., output) a separate column address and a separate row address.

The address latch 310 may provide row and column addresses to a row address decoder 322 and a column address decoder 328, respectively. The column address decoder 328 may select bit lines extending through the array 302 corresponding to respective column addresses. The row address decoder 322 may be connected to a word line driver 324 that activates respective rows of memory cells in the array 302 corresponding to received row addresses. The selected data line (e.g., a bit line or bit lines) corresponding to a received column address may be coupled to a read/write circuitry 330 to provide read data to an output data buffer 334 via an input-output data bus 340. Write data may be provided to the memory array 302 through an input data buffer 344 and the memory array read/write circuitry 330. The command decoder 306 may respond to memory commands provided to the command bus 308 to perform various operations on the memory array 302. In particular, the command decoder 306 may be used to provide internal control signals to read data from and write data to the memory array 302.

The memory 300 may include current generator 313 that is configured to generate a current ISTAB and a voltage VBGR. The ISTAB current may be used by input receivers of an example of active circuits in a semiconductor chip as bias current. The VBGR voltage may be used by power amps of an example of active circuits in a semiconductor chip as reference voltage.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a plurality of transistors coupled to a voltage source, wherein a gate of each of the plurality of transistors is coupled to a bias line;
a first circuit including first and second resistors and a first diode, the first circuit coupled to a first transistor of the plurality of transistors;
a second circuit including a third resistor and a second diode, the second circuit coupled to a second transistor of the plurality of transistors;
a voltage circuit coupled to a third transistor of the plurality of transistors, the voltage circuit including a fourth resistor, a fifth resistor, and a third diode, the voltage circuit configured to provide a bandgap voltage having a value based on the fourth resistor, the fifth resistor, and the third diode to the bias line;
an output node coupled to a fourth transistor of the plurality of transistors; and
an amplifier comprising a first input coupled to a node between the first transistor and the first circuit and a second input coupled to a node between the second transistor and the second circuit, the amplifier configured to provide an output voltage to the bias line responsive to a voltage differential between the first input and the second input,
wherein a resistance of the third resistor is based on a current through the second diode, such that a temperature slope of a sum of the current through the second diode and a current through the third resistor is substantially equal to zero, and
wherein a current through the fourth transistor provided responsive to the output voltage applied to the bias line remains, based on the first through third resistors, and further based on the fourth and fifth resistors and the third diode providing the bandgap voltage, substantially constant in temperature coefficient.

2. The apparatus of claim 1, wherein the first circuit is configured to adjust a voltage at the first input responsive to a change in temperature, wherein the second circuit is configured to adjust a voltage at the second input responsive to the change in the temperature, wherein the amplifier is configured to adjust the output voltage responsive to the voltage differential between the first input and the second input, wherein the current through the fourth transistor remains substantially constant in temperature coefficient based on the output voltage.

3. The apparatus of claim 1,
wherein the first resistor is coupled between the first input and a reference source;
wherein the second resistor is coupled to the first input; and
wherein the first diode is coupled between the second resistor and the reference source.

4. The apparatus of claim 3,
wherein the third resistor is coupled between the second input and the reference source; and
wherein the second diode is coupled between the second input and the reference source.

5. The apparatus of claim 4, wherein the first resistor is equal to the third resistor.

6. The apparatus of claim 4, wherein the first diode is larger than the second diode.

7. The apparatus of claim 6, wherein the first diode is eight times larger than the second diode.

8. The apparatus of claim 1, wherein the first circuit is configured to adjust a voltage at the first input responsive to a change in voltage of the voltage source, wherein the second circuit is configured to adjust a voltage at the second input responsive to the change in the voltage of the voltage source, wherein the amplifier is configured to adjust the output voltage responsive to the voltage differential between the first input and the second input, wherein the current through the fourth transistor remains substantially constant in temperature coefficient based on the output voltage.

9. A method, comprising:
providing an output voltage from an amplifier responsive to a voltage differential at inputs of the amplifier;
responsive to the output voltage, coupling a voltage source to an output node via a first transistor;
providing a current through the first transistor based on the output voltage;
providing a substantially constant bandgap voltage based on a voltage circuit including a first resistor coupled in parallel with a diode and a second resistor; and
adjusting the output voltage based on a change in the voltage differential caused by a process, voltage, or temperature change such that the current provided by the first transistor responsive, at least on part, to the bandgap voltage based on the voltage circuit including the first resistor coupled in parallel with the diode and the second resistor, remains substantially constant in temperature coefficient.

10. The method of claim 9, further comprising:
providing a first voltage to a first input of the amplifier via a first circuit; and
providing a second voltage to a second input of the amplifier via a second circuit.

11. The method of claim 10, further comprising:
coupling the voltage source to the first circuit via a second transistor; and
coupling the voltage source to the second circuit via a third transistor.

12. The method of claim 9, further comprising:
responsive to the output voltage, coupling the voltage source to the voltage circuit via a second transistor; and
providing the bandgap voltage from the voltage circuit based on the output voltage.

* * * * *